(12) United States Patent
Gleason

(10) Patent No.: US 6,392,617 B1
(45) Date of Patent: May 21, 2002

(54) ACTIVE MATRIX LIGHT EMITTING DIODE DISPLAY

(75) Inventor: Robert E. Gleason, San Carlos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/428,338

(22) Filed: Oct. 27, 1999

(51) Int. Cl.$^7$ ................................................ G09G 3/32
(52) U.S. Cl. ............................ 345/82; 345/80; 345/207
(58) Field of Search ............................... 345/81, 82, 83, 345/76, 77, 80, 207; 315/149, 158

(56) References Cited

U.S. PATENT DOCUMENTS

| | | | | |
|---|---|---|---|---|
| 4,810,937 A | * | 3/1989 | Havel | 315/152 |
| 5,089,748 A | * | 2/1992 | Ihms | 315/151 |
| 5,345,167 A | | 9/1994 | Hasegawa et al. | 323/349 |
| 5,550,066 A | | 8/1996 | Tang et al. | 437/40 |
| 5,719,589 A | | 2/1998 | Norman et al. | 345/82 |
| 5,736,754 A | | 4/1998 | Shi et al. | 257/89 |
| 5,783,909 A | | 7/1998 | Hochstein | 315/159 |
| 5,940,053 A | | 8/1999 | Ikeda | 345/77 |
| 5,952,789 A | | 9/1999 | Stewart et al. | 315/169.4 |

OTHER PUBLICATIONS

1998, Design of an Improved Pixel for a Polysilicon Active–Matrix Organic LED Display, Stewart et al., SID 98 Digest, pp. 11–14.

* cited by examiner

Primary Examiner—Steven Saras

(57) ABSTRACT

An active matrix pixel within an active matrix display includes a photodiode that is optically connected to a light emitting diode within the pixel in order to detect a portion of the luminous flux that is generated by the light emitting diode. The photodiode discharges excess charge within the pixel in response to the detected portion of luminous flux. Once the excess charge is discharged, the light emitting diode stops emitting light. In an embodiment, the gate of a drive transistor is controlled by the charge on a storage node. If the charge on the storage node sets a voltage that exceeds the threshold voltage of the drive transistor then the drive transistor conducts. The amount of charge on the storage node above that which is needed to set the threshold voltage is referred to as the excess charge.

20 Claims, 4 Drawing Sheets

ACTIVE MATRIX LIGHT EMITTING DIODE DISPLAY

FIELD OF THE INVENTION

The present invention relates to active matrix display devices, and more particularly to drive circuitry that is located within each pixel of an active matrix display.

BACKGROUND OF THE INVENTION

Arrays of organic light emitting diodes (OLEDs) are being utilized to create two-dimensional flat panel displays. As compared to conventional light emitting diodes (LEDs), which are made of compound semiconductors, the low cost and ease of patterning OLEDs makes compact, high resolution arrays practical. OLEDs can be adapted to create either monochrome or color displays and the OLEDs may be formed on transparent or semiconductor substrates.

As is known in the art, arrays of OLEDs and LEDs are typically classified as passive matrix arrays or active matrix arrays. In a passive matrix array, the current drive circuitry is external to the array, and in an active matrix array, the current drive circuitry includes one or more transistors that are formed within each pixel. An advantage of active matrix arrays over passive matrix arrays is that active matrix arrays do not require peak currents that are as high as passive matrices. High peak currents are generally undesirable because they reduce the luminous efficiency of available OLEDs. Because the transparent conducting layer of an active matrix can be a continuous sheet, active matrix arrays also mitigate voltage drop problems which are experienced in the patterned transparent conductors of passive matrices.

FIGS. 1 and 2 are depictions of active matrix pixels that are known in the prior art. It should be understood that although individual active matrix pixels are shown for description purposes, the individual active matrix pixels shown in FIGS. 1 and 2 are typically part of an array of pixels that are located closely together in order to form a display. As shown in FIGS. 1 and 2, each of the active matrix pixels includes an address line 102 and 202, a data line 104 and 204, an address transistor 106 and 206, a drive transistor 108 and 208, a storage node 110 and 210, and an OLED 112 and 212. The address lines allow the pixels to be individually addressed and the data lines provide the voltage to activate the drive transistors. The address transistors control the writing of data from the data lines to the storage nodes. The storage nodes are represented by capacitors, although they need not correspond to separate components because the gate capacitance of the drive transistors and the junction capacitance of the address transistors may provide sufficient capacitance for the storage nodes. As shown, the OLEDs are connected to a drive voltage ($V_{LED}$) and the current that flows through the OLEDs is controlled by the drive transistors. When current is allowed to flow through the drive transistors, the OLEDs give off light referred to as a luminous flux, as indicated by the arrows 114 and 214.

Referring to FIG. 1, PMOS transistors are preferred when the cathode of the OLED 112 is grounded, and referring to FIG. 2, NMOS transistors are preferred when the anode of the OLED 212 is connected to the supply voltage ($V_{LED}$). Utilizing the PMOS and NMOS transistors as shown in FIGS. 1 and 2 makes the gate to source voltages of the drive transistors 108 and 208 insensitive to voltage drops across the OLEDs, thereby improving the uniformity of the light 114 and 214 that is given off by the OLEDs.

The operation of the prior art active matrix pixels is described with reference to the active matrix pixel configuration shown in FIG. 2, although the same concepts apply to the active matrix pixel of FIG. 1. The active matrix pixel shown in FIG. 2 serves as an analog dynamic memory cell. When the address line 202 is high, the data line 204 sets the voltage on the storage node 210, which includes the gate of the drive transistor 208. When the voltage on the storage node exceeds the threshold voltage of the drive transistor, the drive transistor conducts causing the OLED 212 to emit light 214 until the voltage on the storage node drops below the threshold voltage of the drive transistor, or until the voltage on the storage node is reset through the address transistor 206. The voltage on the storage node will typically drop due to leakage through the junction of the address transistor and through the gate dielectric of the drive transistor. However, with sufficiently low leakage at the address and drive transistors and high capacitance at the storage node, the current through the OLED is held relatively constant until the next voltage is set on the storage node. For example, the voltage is typically reset at a constant refresh interval as is known in the art. The storage node is represented as a capacitor in order to indicate that sufficient charge must be stored on the storage node to account for leakage between refresh intervals. As stated above, the capacitor does not necessarily represent a separate component because the gate capacitance of the drive transistor and the junction capacitance of the address transistor may suffice.

In the active matrix pixel of FIG. 2, the voltage on the storage node 210 determines the intensity of the light 214 that is generated by the OLED 212. If the intensity-current relationship of the OLED and gate voltage-current relationship of the drive transistor 208 are known, according to one method, the desired intensity of light is generated by placing the corresponding voltage on the storage node. Setting the voltage on the storage node is typically accomplished by utilizing a digital to analog converter to establish the voltage on the corresponding data line 204. In an alternative method, the storage node is first discharged by grounding the data line, and then the data line is set to the CMOS supply voltage ($V_{dd}$). Utilizing the latter method, the address transistor 202 functions as a current source, charging the storage node until the storage node is isolated by setting the address line low. The latter method offers the benefit of not requiring a digital to analog converter on each data line. However, one disadvantage of the latter method is that the storage node capacitance within a single pixel is a non-linear function of the voltage when supplied by the gates and junctions of the transistors. Another disadvantage is that the storage node capacitance of each pixel varies among the pixels in an array.

As described above, in order to obtain the desired luminous flux from the OLED 212 of FIG. 2, the voltage on the data line 204 is adjusted to control the current through the drive transistor 208. Unfortunately, current flow through the drive transistor also depends on characteristics of the drive transistor, such as its threshold voltage and transconductance. Large arrays of drive transistors, as required to make a high-resolution display, exhibit variations in threshold voltage and transconductance that often cause the drive currents of the OLEDs to differ for identical control voltages, which in turn causes a display to appear non-uniform. In addition, different OLEDs emit different intensities of light even when driven with identical currents. Furthermore, the light intensity for a specified drive current drops as an OLED ages and different OLEDs can degrade at different rates, again causing a display to appear non-uniform.

Active matrix pixels are preferably implemented with a silicon substrate instead of a transparent dielectric substrate because transparent dielectric substrates require the transistors to be built as thin film devices. It is difficult to obtain a tight distribution of threshold voltages in large arrays of thin-film transistors especially as more transistors are needed to make the luminous flux from each pixel insensitive to threshold variations. With a silicon substrate, addressing, driving, and other circuit functions, can be easily integrated, particularly if the substrate and process are compatible with CMOS technology. Although known active matrix pixel technology is compatible with older CMOS technology, OLEDs require higher voltages than dense CMOS can tolerate, while dense CMOS is desirable for the small pixels that are required for high-resolution color displays.

A technique that has been utilized to produce a uniform luminous flux in other LED applications involves providing feedback to an LED through the use of a photosensor. Providing feedback to an LED utilizing known techniques typically involves amplifiers and comparators, which require much more circuitry than can fit into a single pixel of, for example, a high-resolution color display.

As described above the intensity of light generated by an OLED is influenced by the voltage supplied to the storage node and by characteristics of the drive transistors and OLEDs, which can vary from pixel to pixel. The differences in the characteristics of the pixels can produce non-uniform light intensities. In addition, as OLEDs age, the degree of non-uniformity may change. As a result, what is needed is a system and method for individually driving each pixel in an active matrix array that provides uniform luminous flux while meeting the size limitations of active matrix displays.

SUMMARY OF THE INVENTION

An active matrix pixel within an active matrix display includes a photodiode that is optically connected to a light emitting diode within the pixel in order to detect a portion of the luminous flux that is generated by the light emitting diode. The photodiode discharges excess charge within the pixel in response to the detected portion of luminous flux. Once the excess charge is discharged, the light emitting diode stops emitting light. In an embodiment, the gate of a drive transistor is controlled by the charge on a storage node. If the charge on the storage node sets a voltage that exceeds the threshold voltage of the drive transistor then the drive transistor conducts. The amount of charge on the storage node above that which is needed to set the threshold voltage is referred to as the excess charge.

As long as the excess charge is present, the drive transistor conducts and the light emitting diode emits a luminous flux. However, when the excess charge is discharged from the storage node the voltage on the storage node drops below the threshold voltage of the drive transistor, the drive transistor stop conducting, and the light emitting diode stops emitting a luminous flux. The amount of luminous flux generated by the light emitting diode can be controlled by controlling the amount of excess charge that is placed on the storage node. Because the excess charge on the storage node is discharged in proportion to the amount of luminous flux that has been received by the photodiode, the luminous flux of the pixel is insensitive to the variation in characteristics of the drive transistor and the light emitting diode. The insensitively to the variation within each pixel of an active matrix pixel array allows the array to provide a more uniform luminous flux across the display.

In an embodiment, the active matrix pixel includes an address line, a data line, an address transistor a drive transistor, a storage node, an OLED, and a photodiode. The address line allows the pixel to be individually addressed and the data line provides the voltage to activate the drive transistor. The capacitor does not necessarily represent a separate physical component, but can represent the capacitance of the gates and junctions connected to the storage node. The drive transistor conducts as long as the voltage on the storage node exceeds the corresponding threshold voltage of the drive transistor. It should be understood that although a single active matrix pixel is described, the single pixel is typically part of an array of pixels that are located closely together in order to form a display.

The photodiode is optically coupled to the OLED so that the photodiode can detect a portion of the light that is generated by the OLED. The photodiode discharges the excess charge that is present on the storage node at a rate that is proportional to the luminous flux that is generated by the OLED. Because the photodiode discharges the excess charge on the storage node in proportion to the luminous flux of the OLED, the drive transistor and the OLED are turned off when the integrated flux detected by the photodiode has reached a value that is equivalent to the excess charge that is on the data line.

In operation, the address line of the active matrix pixel is set high for a period of time that charges the storage node with a desired amount of excess charge. Once the storage node is sufficiently charged, the address line is set low, effectively isolating the storage node from the data line. The drive transistor begins to conduct current as soon as the threshold voltage of the drive transistor is exceeded. Current conducting through the drive transistor causes the OLED to give off a luminous flux. A portion of the luminous flux is detected by the photodiode and in response, the photodiode discharges the charge on the storage node at a rate that id directly proportional to the luminous flux that is detected by the photodiode. At the point where the integrated value of the detected luminous flux equals the excess charge on the storage node, the voltage on the storage node drops below the threshold voltage of the storage node. Once the voltage on the storage node drops below the threshold voltage of the drive transistor, current stops flowing through the drive transistor and the OLED stops generating light.

In an embodiment, an additional transistor, referred to as the isolation transistor, is connected to the logical complement of the address line. Connecting the isolation transistor to the logical complement of the address line, prevents the isolation transistor from turning on the drive transistor when the storage node is being written from the data line. With the isolation transistor in place, the action of the photodiode controls the flow of current through the drive transistor and the OLED, and the OLED does not emit light until the address line goes low.

In an embodiment, the active matrix pixel may utilize a bipolar transistor as the drive transistor. The role of the bipolar transistor is solely to withstand $V_{LED}$ and the bipolar transistor does not need to provide high gain or operate at high frequencies.

DETAILED DESCRIPTION OF THE INVENTION

Figure 2:
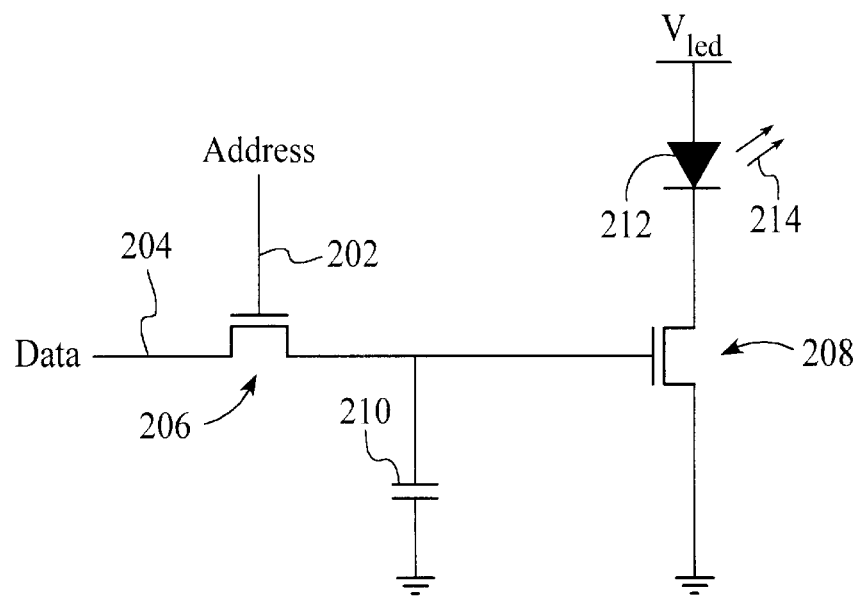
FIG. 2 is a depiction of an active matrix pixel that utilizes NMOS transistors as known in the prior art.
Figure 3:
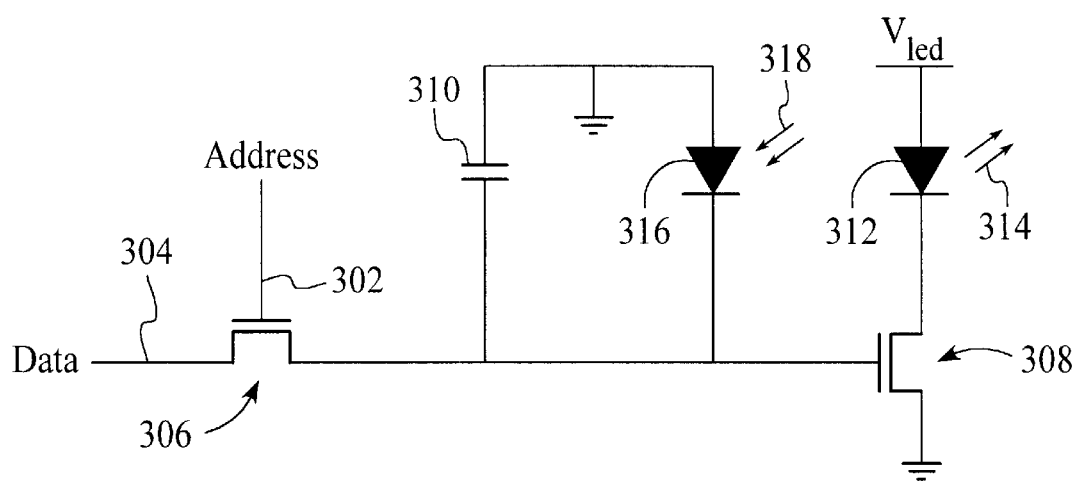
FIG. 3 is a depiction of an active matrix pixel that incorporates a photodiode in accordance with an embodiment of the invention.

FIG. 3 depicts an embodiment of an active matrix pixel that incorporates a photodiode 316. It should be understood that although a single active matrix pixel is shown for description purposes, the single pixel is typically part of an array of pixels that are located closely together in order to form a display. The active matrix pixel includes an address line 302, a data line 304, an address transistor 306, a drive transistor 308, a storage node 310, an organic light emitting diode (OLED) 312, and the photodiode. As described with reference to FIG. 2, the address line allows the pixel to be individually addressed and the data line provides the voltage to activate the drive transistor. The capacitor does not necessarily represent a separate physical component, but can represent the capacitance of the gates and junctions connected to the storage node. As with the circuit of FIG. 2, the drive transistor of FIG. 3 conducts as long as the charge on the storage node is high enough that the voltage on the storage node exceeds the corresponding threshold voltage of the drive transistor. The charge on the storage node that raises the voltage on the storage node above the threshold voltage of the drive transistor is referred to as the excess charge. In an embodiment, the circuit within each pixel is fabricated with a dense, low voltage CMOS process.

The difference between the circuit of FIG. 2 and the circuit of FIG. 3 is that the photodiode 316 has been added to the circuit of FIG. 3. The photodiode is optically coupled to the OLED 312 so that the photodiode can detect a portion of the light 318 that is generated by the OLED. The photodiode discharges charge that is present on the storage node 310 at a rate that is proportional to the luminous flux that is generated by the OLED. Because the photodiode discharges charge on the storage node in proportion to the luminous flux of the OLED, the drive transistor 308 and the OLED are turned off when the integrated flux detected by the photodiode has reached a value that is equivalent to any excess charge that has been placed on the data line.

In operation, the address line 302 of the active matrix pixel of FIG. 3 is set high for a period of time that charges the storage node 310 with a desired amount of excess charge. Once the storage node is sufficiently charged, the address line is set low, effectively isolating the storage node from the data line 304. The drive transistor 308 begins to conduct current as soon as the threshold voltage of the drive transistor is exceeded. Current conducting through the drive transistor causes the OLED 312 to give off a luminous flux, as represented by the light 314 emanating from the OLED. A portion of the luminous flux, as represented by the light 318, is detected by the photodiode, and in response, the photodiode begins to discharge the charge on the storage node at a rate that is directly proportional to the luminous flux that is detected by the photodiode. At the point where the integrated value of the detected luminous flux equals the excess charge on the storage node, the voltage on the storage node drops below the threshold voltage of the storage node. Once the voltage on the storage node drops below the threshold voltage of the drive transistor, current stops flowing through the drive transistor and the OLED stops generating light. With appropriate choices of drive currents and discharge rates and by controlling the excess charge on the storage node, the turn off time of the drive transistor can be set to occur within the refresh interval of the display. If the efficiency of the OLED or the drive of transistor changes, the amount of excess charge on the storage node can be adjusted so that a constant luminous flux is maintained.

Figure 1:
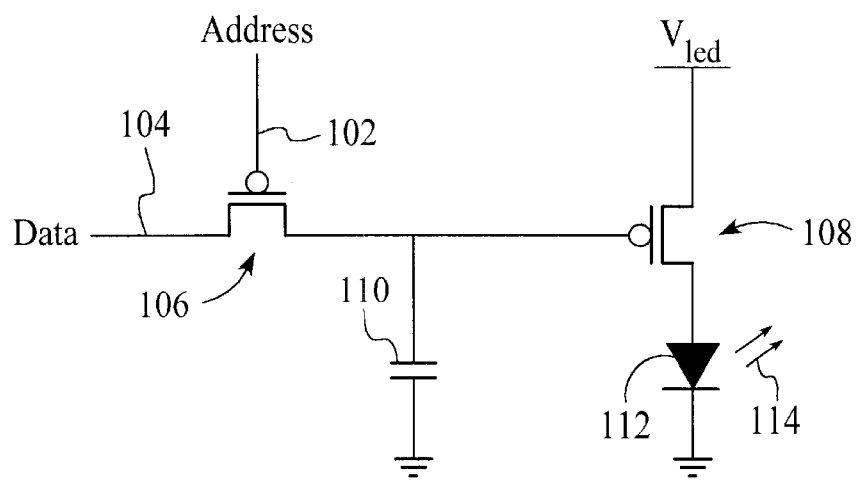
FIG. 1 is a depiction of an active matrix pixel that utilizes PMOS transistors as known in the prior art.

As described, the circuit of FIG. 3 controls luminous flux by controlling the excess charge that is placed on the storage node 310. In contrast, the circuits of FIGS. 1 and 2 control luminous flux by controlling, with a digital to analog converter, the voltage that is supplied to the storage nodes 110 and 210 through the data lines 104 and 204.

In the embodiment of the active matrix pixel of FIG. 3, the photodiode 316 begins to regulate the emission of light from the OLED 312, as described above, at the moment the address line 302 goes low. However, during the time that the address line is high and current is flowing through the data line 304 to the storage node 310, the OLED emits light that is unregulated by the feedback action of the photodiode. The unregulated emission of light may be insignificant if the address time is a small fraction of the refresh interval.

Figure 4:
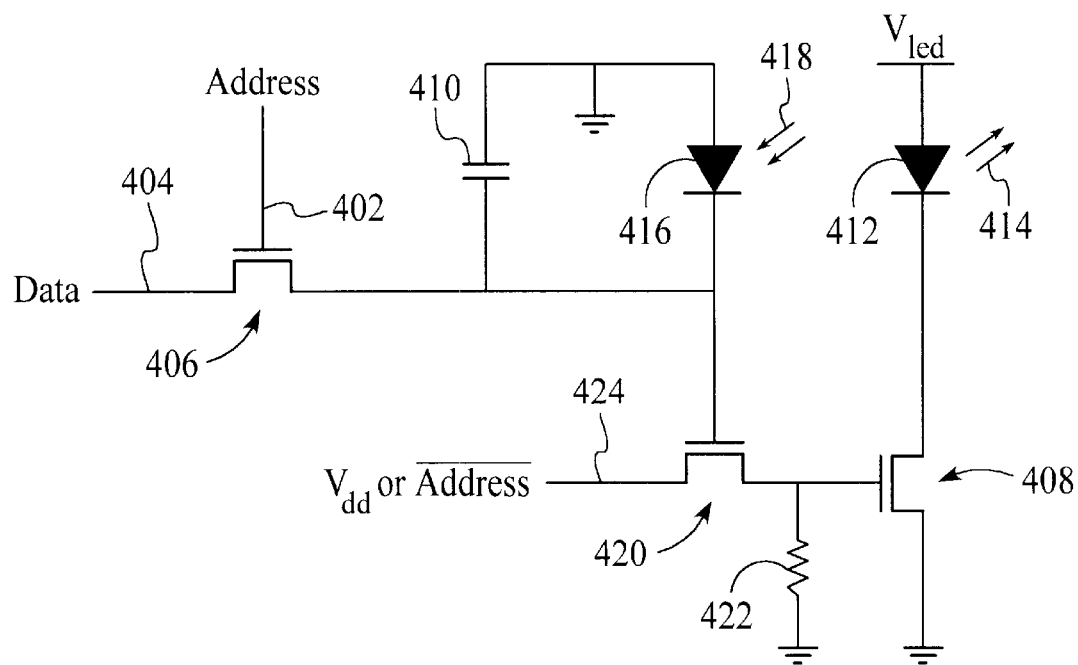
FIG. 4 is a depiction of an active matrix pixel that incorporates a photodiode, wherein the data line is separated from the OLED by an additional transistor in accordance with an embodiment of the invention.

FIG. 4 is a depiction of an embodiment of an active matrix pixel that minimizes the unregulated emission of light during the time that the address line is high. The components in the active matrix pixel of FIG. 4 are the same as the components in the active matrix pixel of FIG. 3 except that the active matrix pixel of FIG. 4 includes an additional transistor 420 and an additional resistor 422. Components in FIG. 4 that coincide with components in FIG. 3 are numbered similarly. In an embodiment, the additional transistor, referred to as the isolation transistor, is connected to the storage node 410 by its gate and to the logical complement of the address line 424 at its source. In another embodiment, the isolation transistor may be connected to $V_{dd}$ at its source. In the active matrix pixel of FIG. 4, the charge on the storage node controls the gate of the isolation transistor. When the charge on the storage node is sufficient to raise the voltage on the storage node above the threshold voltage of the isolation transistor, the isolation transistor can conduct. Connecting the isolation transistor to the logical component of the address line prevents the isolation transistor from turning on the drive transistor 408 when the storage node is being written from the data line 404. With the isolation transistor implemented as shown in FIG. 4 the photodiode 416 controls the flow of current through the drive transistor and the OLED 412, and the OLED does not emit light until the address line 402 goes low. That is, when the excess charge on the storage node has been discharged by the photodiode, the isolation transistor stops conducting and the gate of the drive transistor goes low. Connecting the resistor to ground as shown in FIG. 4 is necessary so that the drive transistor can turn off after the isolation transistor is open. Although shown as a resistor in FIG. 4, the component may alternatively be a MOS transistor configured to provide the appropriate resistance according to methods known to those skilled in the art.

The voltage ($V_{LED}$) needed to drive the OLEDs 312 and 412 in the circuits shown in FIGS. 3 and 4 typically exceeds the maximum voltage allowed in dense CMOS processes. As a consequence of the high voltage, when the OLEDs are off, $V_{LED}$ may appear at the drain of each drive transistor 308 and 408. In an embodiment, the adverse effects of the high $V_{LED}$ may be mitigated by lengthening the channel of the drive transistor and/or increasing the spaces between the drive transistor drain and other devices. In another embodiment, when a higher $V_{LED}$ is needed, an additional boron implant in the drive transistor may be useful to reduce the depletion length of the drive transistor, thereby permitting dense packing of transistors without punch through. In another embodiment, when an even higher $V_{LED}$ causes gate oxide breakdown, a thicker oxide layer may be necessary. The negative effects of the high $V_{LED}$ may also be mitigated by fabricating the drive transistors in a thin film of amorphous or poly-crystalline silicon, rather than the underlying silicon substrate. Because $V_{LED}$ is isolated on the drain of the thin-film device, the density of the remaining circuitry need not be reduced to accommodate $V_{LED}$.

In the active matrix pixel of FIG. 3, the threshold voltage of the drive transistor sets the lower limit of the dynamic range of the circuit. However, in the active matrix pixel of FIG. 4, the threshold of the isolation transistor 420 sets the lower limit of dynamic range of the circuit. Because the isolation transistor sets the lower limit of the dynamic range, there is no need to increase the threshold voltage of the isolation transistor to accommodate any voltage higher than $V_{dd}$. The active matrix pixel of FIG. 4 may provide a wider dynamic range than the active matrix pixel of FIG. 3 when it is necessary to use a drive transistor with either higher thresholds or greater variability.

Figure 5:
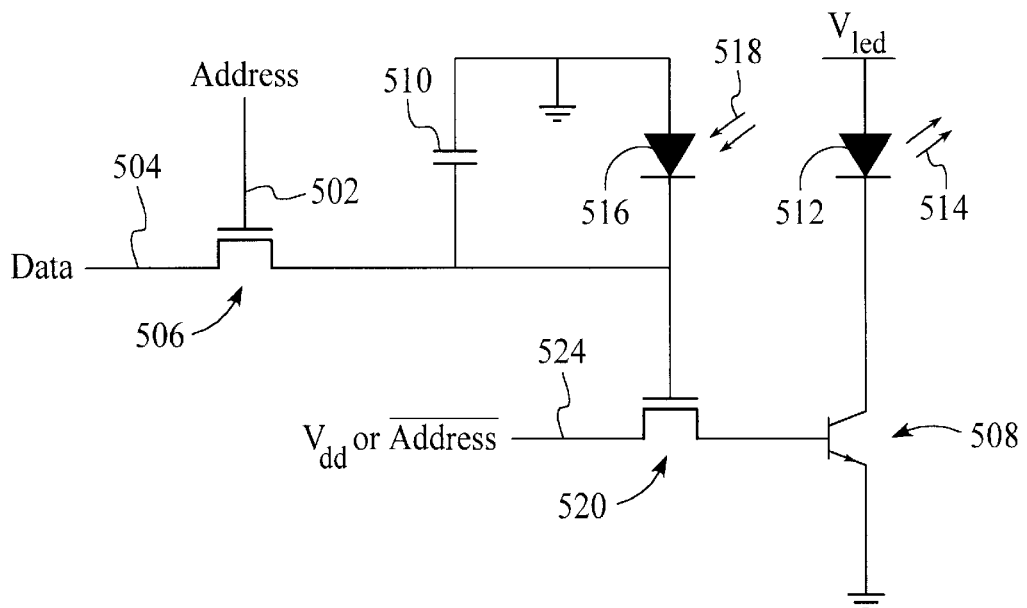
FIG. 5 is a depiction of an active matrix pixel that is controlled by a photodiode, wherein the data line is separated from the OLED by an additional transistor in accordance with an embodiment of the invention.

FIG. 5 depicts an embodiment of an active matrix pixel that incorporates a photodiode 516 and an isolation transistor 520 similar to the active matrix pixel of FIG. 4. Components in FIG. 5 that coincide with components in FIGS. 3 and 4 are numbered similarly. The active matrix pixel of FIG. 5 differs from the active matrix pixel of FIG. 4 in that a bipolar transistor is utilized as the drive transistor 508. The bipolar transistor of FIG. 5 replaces the NMOS transistor and resistor combination of FIG. 4. The bipolar transistor is easily added to a CMOS process. As with the active matrix pixels of FIGS. 3 and 4, excess charge placed on the storage node 510 controls the luminous flux that is generated by the OLED 512. Current gain and other variables associated with the bipolar transistor have negligible effects on the luminous flux. The role of the bipolar transistor is solely to withstand $V_{LED}$ and the bipolar transistor does not need to provide high gain or operate at high frequencies. The lack of demand for either high performance or tight control makes it advantageous to add a bipolar transistor to a CMOS process. In an embodiment, the n-well of the drive transistor is used as a collector and the emitter is formed with the NMOS source and drain implants. The only additional processing steps may include an implant to form the base.

Figure 6:
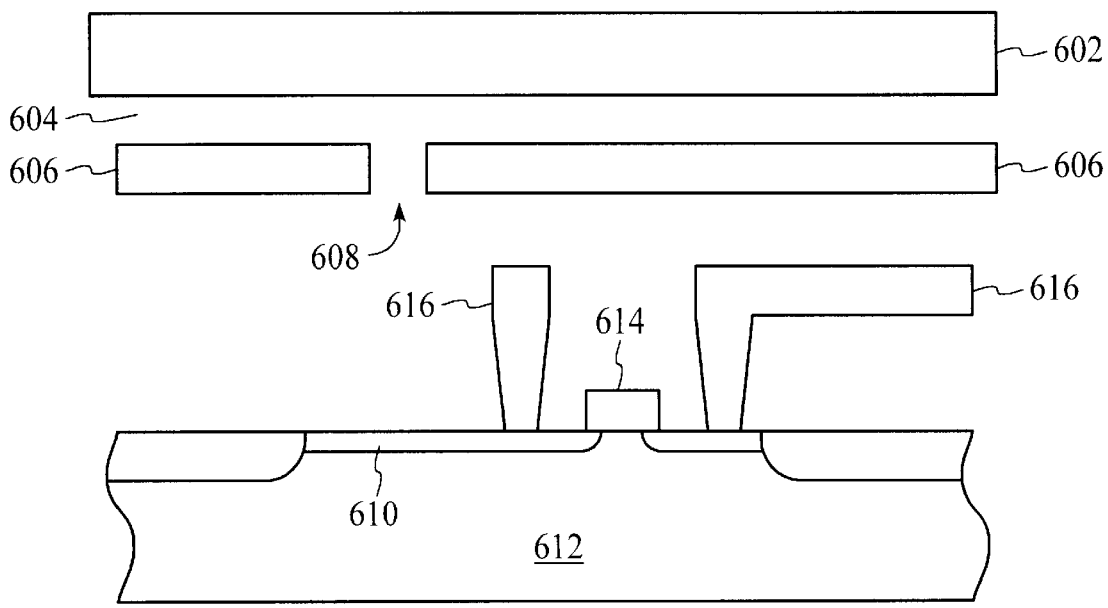
FIG. 6 is a cross-section of part of an active matrix pixel that includes a photodiode as described with reference to FIGS. 3–5.

The use of photodiodes 316, 416, and 516 to control the luminous intensity of each pixel in an array of pixels as described with reference to FIGS. 3–5 requires that each photodiode collect light from its corresponding OLED, but not light from other pixels in the array. Furthermore, it is preferable to minimize the amount of light needed by the feedback circuit and maximize the collection efficiency of the display. FIG. 6 is a cross-section of part of an active matrix pixel that includes a photodiode as described with reference to FIGS. 3–5. The cross-section includes an OLED 602, a transparent insulator 604, a reflective metal layer 606, a photodiode, and an address transistor. The OLED sits on the transparent insulator over the layer of reflecting metal. Small openings 608 are patterned in the metal layer to allow light from the OLED to pass to the photodiode formed by an n+ diffusion 610 and a p substrate 612. As shown in the FIG. 6, the photodiode may be a simple extension of the address transistor 306, 406, and 506. The gate 614 and interconnection 616 to the address transistor are shown in FIG. 6. The ratio of the thickness of the reflective metal layer to the diameter of the opening can be chosen to confine the illumination of the substrate to the photodiode. The reflective layer and openings serve to block light from adjacent pixels, and to prevent light from affecting operation of the transistors in the pixel. In the case of color displays employing, for example, red, green, and blue OLEDs, different opening sizes may be selected for different colors. Because the opening sizes determine the fractions of total luminous flux collected by the photodiodes, different sizes for different colors may compensate for differences in quantum efficiency of the OLEDs and photodiodes. In this manner, the same circuit design and voltage levels are suitable for pixels of each color, in spite of the different efficiencies of the OLED materials and wavelength dependencies of the photodiodes.

Figure 7:
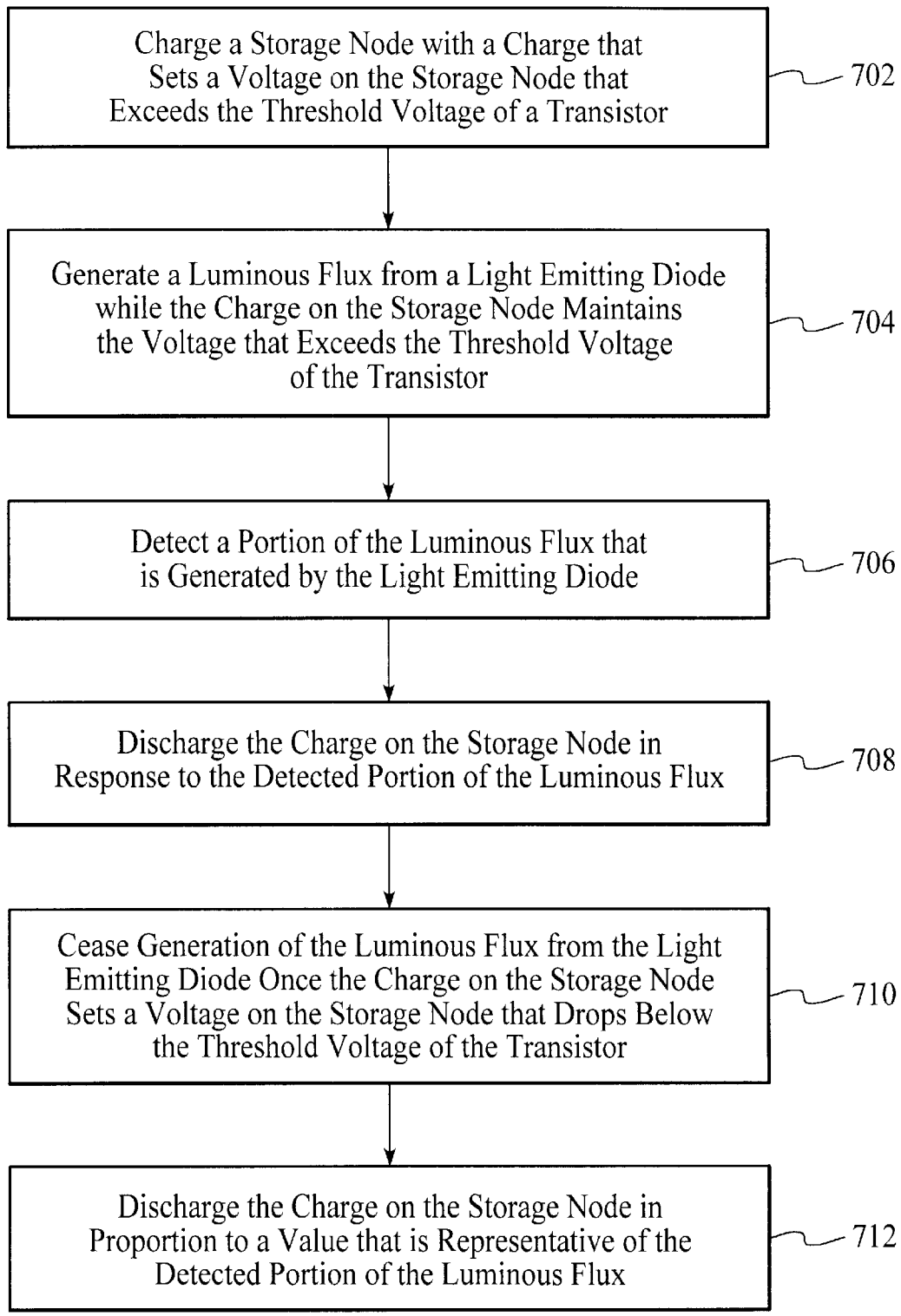

FIG. 7 is a process flow diagram of a method for controlling the light that is emitted from each pixel in an active matrix array. According to the method, a storage node is charged with a charge that sets a voltage on the storage node that exceeds the threshold voltage of a transistor (Step 702). Next, luminous flux is generated from a light emitting diode that is part of the pixel. The luminous flux is generated while the charge on the storage node maintains a voltage that exceeds the threshold voltage of the transistor (Step 704). Next, a portion of the luminous flux that is generated by the light emitting diode is detected (Step 706). The charge on the storage node is then discharged in response to the detected portion of the luminous flux (Step 708). Once the charge on the storage node sets a voltage that drops below the threshold voltage of the transistor, the generation of the luminous flux from the light emitting diode is ceased (Step 706). In an additional step, the charge on the storage node is discharged in proportion to a value that is representative of the detected portion of the luminous flux (Step 712).

Although the active matrix pixels of FIGS. 3–6 are described as utilizing OLEDs, other types of LEDs can be implemented in the manner described with reference to FIGS. 3–6. It should be understood that the active matrix pixel described with reference to FIGS. 3–6 could be implemented in a configuration such as the configuration of FIG. 1 where the cathode of the OLED is grounded.

The active matrix pixels as described with reference to FIGS. 3–6 allow an OLED to be driven at approximately 3–10 volts by adding either thin-film MOS transistors or bipolar transistors to a CMOS process that operates down to approximately 1.5 volts. The active matrix pixels, as described with reference to FIGS. 3–6, also allow the regulation of luminous flux from each pixel by adding a photosensor to the driving circuit of each pixel. The photosensors compensate for the variation of luminous flux in each pixel and for variations in some characteristics of the driving elements, which would otherwise make the luminous flux non-uniform. In particular, the photosensors make the luminous flux generated by the OLEDs insensitive to the transconductance of the thin film MOS transistor or the current gain of the bipolar transistor added to solve the voltage problem. The insensitivity and the lack of need for high frequency response allow bipolar transistors to be utilized with minimal extra processing and cost.

What is claimed is:
1. An active matrix pixel within an active matrix display comprising:
   a light emitting diode, that is specific to a pixel of said active matrix display, for generating luminous flux;

means, that is specific to said pixel, for storing an excess charge; and means, that is specific to said pixel and optically connected to said light emitting diode, for detecting a portion of said luminous flux that is generated by said light emitting diode, and for discharging said excess charge in response to said detected portion of said luminous flux.

2. The active matrix pixel of claim 1 further including means for preventing said generation of luminous flux when said excess charge has been discharged.

3. The active matrix pixel of claim 2 wherein said means for preventing is a drive transistor having a gate that is responsive to said means for storing.

4. The active matrix pixel of claim 1 wherein said light emitting diode is an organic light emitting diode, and wherein said means for detecting is a photodiode formed within said pixel to receive said portion of said luminous flux.

5. The active matrix pixel of claim 4 further including a reflective layer between said light emitting diode and said photodiode, with said reflective layer having an opening that allows said portion of said luminous flux to be detected by said photodiode.

6. The active matrix pixel of claim 1 further including means for isolating said means for storing from said light emitting diode while excess charge is being stored.

7. The active matrix pixel of claim 6 wherein said means for isolating includes a transistor having a gate that is connected to said storage node, a source that is connected to a complement of an address line of said pixel, and a drain that is connected to a drive transistor.

8. The active matrix pixel of claim 7 further including means for providing resistance that is located between said means for isolating and said drive transistor.

9. A method of controlling light emitted from each pixel in an active matrix array comprising steps of:

charging a storage node with a charge that sets a voltage on the storage node that exceeds the threshold voltage of a transistor, said storage node and said transistor being incorporated into a pixel of said active matrix array;

generating luminous flux from a light emitting diode that is part of said pixel while said charge on said storage node maintains said voltage that exceeds said threshold voltage of said transistor;

detecting a portion of said luminous flux that is generated by said light emitting diode;

discharging said charge on said storage node in response to said detected portion of said luminous flux; and ceasing said generation of luminous flux from said light emitting diode once said charge on said storage node sets a voltage on said storage node that drops below said threshold voltage of said transistor.

10. The method of claim 9 wherein said step of charging said storage node includes a step of setting an address transistor to high for a measured time interval.

11. The method of claim 9 wherein said step of discharging said charge is a step of discharging said charge in proportion to a value that is representative of said detected portion of luminous flux.

12. The method of claim 11 wherein said step of ceasing includes a step of ceasing said generation of said luminous flux from said light emitting diode when a value that is representative of said discharged charge is exceeded by a value that is representative of said detected portion of said luminous flux.

13. An active matrix pixel within an active matrix display comprising:

an address line;

a data line;

a storage node for storing an electrical charge;

an address transistor having a gate that is activated from said address line, a source that is connected to said data line, and a drain that is connected to said storage node;

a drive transistor having a gate that is responsive to said storage node;

a light emitting diode connected to a circuit that includes said drive transistor, wherein said light emitting diode emits a luminous flux when said drive transistor completes said circuit; and a photodiode that is optically connected to said light emitting diode in order to receive a portion of said luminous flux that is emitted from said light emitting diode, and that is electrically connected to said storage node in order to discharge said electrical charge on said storage node in proportion to said portion of said luminous flux that is received by said photodiode.

14. The active matrix pixel of claim 13 wherein said gate of said drive transistor is directly connected to said storage node.

15. The active matrix pixel of claim 13 further including an isolation transistor having a gate that is connected to said storage node and a drain that is connected to said gate of said drive transistor.

16. The active matrix pixel of claim 15 wherein said isolation transistor has a source that is connected to a complement of said address line.

17. The active matrix pixel of claim 15 further including means for providing resistance between said drain of said isolation transistor and said gate of said drive transistor.

18. The active matrix pixel of claim 13 wherein said drive transistor is a bipolar transistor.

19. The active matrix pixel of claim 13 wherein said drive transistor is a thin film MOS transistor.

20. The active matrix pixel of claim 13 further including a reflective metal layer that is located between said light emitting diode and said photodiode, said reflective metal layer having an opening that enables said portion of said luminous flux to be received by said photodiode.

* * * * *